US 6,731,016 B2

(12) United States Patent
Peterson

(10) Patent No.: US 6,731,016 B2
(45) Date of Patent: May 4, 2004

(54) METHOD AND APPARATUS FOR MARKING MICROELECTRONIC DIES AND MICROELECTRONIC DEVICES

(75) Inventor: Darin L. Peterson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/183,192

(22) Filed: Jun. 25, 2002

(65) Prior Publication Data

US 2002/0168832 A1 Nov. 14, 2002

Related U.S. Application Data

(62) Division of application No. 09/605,580, filed on Jun. 28, 2000, now Pat. No. 6,432,796.

(51) Int. Cl.$^7$ ............................................. H01L 23/544
(52) U.S. Cl. ...................................... 257/797; 438/401
(58) Field of Search ............................... 257/797, 790, 257/788; 438/401

(56) References Cited

U.S. PATENT DOCUMENTS

| | | | |
|---|---|---|---|
| 4,214,249 A | | 7/1980 | Kasai et al. |
| 4,401,992 A | | 8/1983 | Vorst et al. |
| 5,061,341 A | | 10/1991 | Kildal et al. |
| 5,984,190 A | | 11/1999 | Nevill |
| 6,162,651 A | | 12/2000 | Khosropour |
| 6,175,162 B1 | | 1/2001 | Kao et al. |
| 6,181,017 B1 | * | 1/2001 | Hatchard et al. ............ 257/797 |

OTHER PUBLICATIONS

U.S. patent application Ser. No. 09/945,315, Peterson, filed Aug. 30, 2001.
U.S. patent application Ser. No. 10/377,552, Peterson, filed Feb. 27, 2003.

* cited by examiner

Primary Examiner—Hoai Ho
Assistant Examiner—Quoc Hoang
(74) Attorney, Agent, or Firm—Perkins Coie LLP

(57) ABSTRACT

Method and apparatus for marking microelectronic devices, such as bare microelectronic dies and packaged devices, to enhance the identification and automatic handling of wafers, dies and packaged devices. In one embodiment, a microelectronic device includes a first exterior surface, a second exterior surface having a contact array with a plurality of contacts, and an integrated circuit coupled to the contacts. The microelectronic device can further include a marking medium applied to the first exterior surface of the device. In one embodiment, the marking medium includes a contrast film section having an underlying contrast film applied to the first exterior surface and an outer contrast film applied to the underlying contrast film. In another embodiment, the marking medium can include a contrast film section having only an outer contrast film applied to the first exterior surface of the device. The outer contrast film can have a high optical contrast with respect to the underlying contrast film or the first exterior surface of the device, and the outer contrast film can be changed by a selected radiation so that a portion of the outer contrast film can be selectively removed from the device. The marking medium can optionally include a transfer medium attached to the contrast film section.

18 Claims, 5 Drawing Sheets

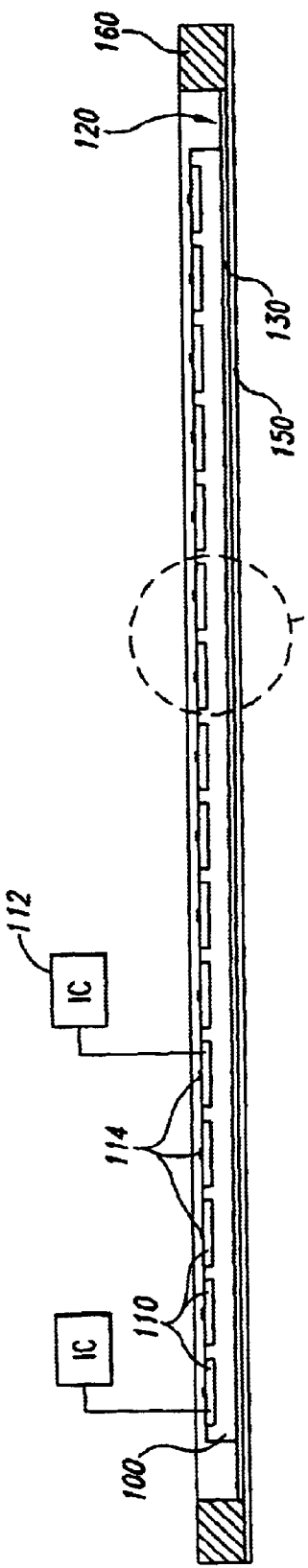
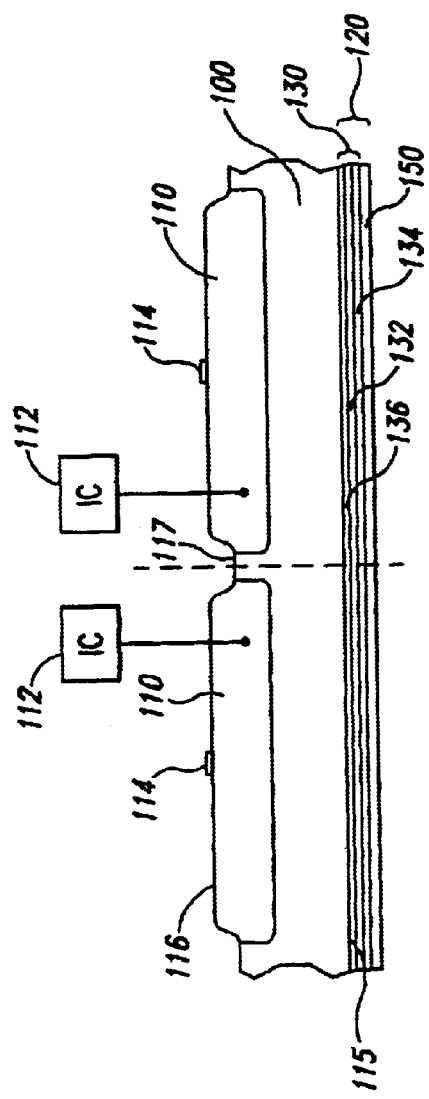

METHOD AND APPARATUS FOR MARKING MICROELECTRONIC DIES AND MICROELECTRONIC DEVICES

CROSS REFERENCE TO RELATED APPLICATION

This application is a divisional U.S. patent application Ser. No. 09/605,580, filed on Jun. 28, 2000, now U.S. Pat. No. 6,432,796.

TECHNICAL FIELD

The present disclosure relates to marking microelectronic devices having a microelectronic die including an integrated circuit; more particularly, several aspects of the invention are related to marking packaged microelectronic devices and bare dies used in microelectronic devices.

BACKGROUND

Microelectronic devices, such as memory devices and microprocessors, typically include a microelectronic die or chip encased in a plastic, ceramic or metal protective covering. The die can include memory cells, processor circuits, interconnecting circuitry and/or other functional features. The die also typically includes an array of very small bond pads electrically coupled to the functional features. When the die is packaged, the bond pads are coupled to leads, solder ball pads or other types of terminals for operatively coupling the microelectronic dies to buses, circuits and/or other microelectronic devices.

Several different techniques have been developed for packaging microelectronic dies. The dies, for example, can be incorporated into individual protective packages, mounted with other components in a hybrid or multiple chip modules, or connected directly to a printed circuit board. When a die is incorporated into an individual protective package, the bond pads on the die are typically coupled to a lead frame and the die is covered or otherwise sealed from the environment. When the die is directly attached to a printed circuit board or another type of substrate, the bond pads on the die are typically coupled to corresponding pads on the substrate using wire bonds, ball grid arrays and other techniques. Such dies that are mounted directly to a substrate are then covered with a plastic, ceramic or other protective material. The dies that are mounted directly to the substrates are generally called Chip Scale Package (CSP) devices and Flip Chip Bare Die devices with solder balls directly attached to a substrate.

Microelectronic device manufacturers typically fabricate a plurality of dies on a wafer and then cut the wafer to separate the dies from one another. After fabricating the dies, manufacturers generally perform additional operations in which they handle and test (a) wafers having a plurality of dies, (b) individual dies after they have been singulated, and (c) the packaged dies. The basic operations that a manufacturer performs after fabricating the dies include backside preparation, die separation, die picking, die inspection, die attachment, wire bonding or flip-chip attachment, preseal inspection, package sealing, plating, trimming, final tests, and other procedures. Throughout several of these procedures the individual dies and the packaged dies are marked with fiducials and identification marks because many of the procedures for packaging the dies are performed by machines that use machine-vision technology to identify and accurately position the dies. Therefore, the fiducials and the identification marks should accordingly be clear, well-defined marks that can be accurately recognized by the machine-vision equipment.

Conventional marking systems for marking bare dies include a laser that changes the color of the silicon on the backside of a die. One conventional marking system specifically uses a laser having a wavelength of 1,064 nm, but other marking to procedures alternatively use lasers with a wavelength of 532 nm. Conventional marking systems that use lasers to change the color of the silicon may have many drawbacks.

One drawback of conventional laser marking systems is that the marks on the silicon may not have sufficient clarity to be accurately recognized by the machine vision equipment. As a result, machine-vision devices may not accurately identify or position the dies during a processing operation. Conventional marking systems may accordingly inhibit the processing equipment from effectively working on a die or a package.

Another drawback of conventional laser marking systems is that the lasers may damage the dies. At least one microelectronic device manufacturer has determined that a 1,064 nm laser may damage the integrated circuits on certain dies. Additionally, if other wavelengths of radiation are operated at higher power settings to produce darker marks, then these lasers may also damage the integrated circuitry. Therefore, conventional laser marking systems may damage the dies at the very end of the fabricating process after a considerable amount of time and money has been expended to produce the dies.

Still another drawback of conventional laser marking systems is that it is time consuming to mark bare silicon dies as well as packaged devices. In a typical application, a laser may make the marks at a "scan rate" of a few hundred millimeters per second. Although such scan rates are relatively quick, it may still require a significant amount of time to mark a large number of dies. Therefore, conventional laser marking systems may become a bottleneck for processing and packaging finished dies.

SUMMARY

The present invention is directed toward marking microelectronic devices, such as bare microelectronic dies and packaged devices, to identify and handle wafers, bare dies and packaged devices. In one embodiment, a microelectronic device includes a first exterior surface, a second exterior surface having a contact array with a plurality of contacts, and an integrated circuit coupled to the contacts. The microelectronic device can further include a marking medium applied to the first exterior surface of the device. In one embodiment, the marking medium includes a contrast film section having an underlying contrast film applied to the first exterior surface and an outer contrast film attached to the underlying contrast film. In another embodiment, the marking medium can include a contrast film section having only an outer contrast film applied to the first exterior surface of the device. The outer contrast film can have a high optical contrast with respect to the underlying contrast film or the first exterior surface of the device, and the outer contrast film can be changed by a selected radiation so that a portion of the outer contrast film can be selectively removed from the device. The marking medium can optionally include a transfer medium attached to the contrast film section.

Several embodiments of the invention are directed toward methods of marking a microelectronic device having a microelectronic die including an integrated circuit. In one embodiment, a marking method can include applying a marking medium to a surface on either the microelectronic die or a package that encases the microelectronic die. The marking medium can have an outer contrast film that has a high optical contrast with respect to a material immediately under the outer contrast film. This embodiment of the method can also include selectively removing a portion of the outer contrast film to leave a patterned portion on the microelectronic device. The patterned portion of the outer contrast film that is left on the microelectronic device and the material immediately under the outer contrast film define a mark on the microelectronic device.

BRIEF DESCRIPTION OF THE DRAWINGS

FIG. 1 is a cross-sectional view of a marking medium attached to a wafer having a plurality of microelectronic dies in accordance with one embodiment of the invention.

FIG. 2 is a partial cross-sectional view of the marking medium and the wafer of FIG. 1 at one stage of a method for marking microelectronic dies in accordance with one embodiment of the invention.

DETAILED DESCRIPTION

Figure 3:
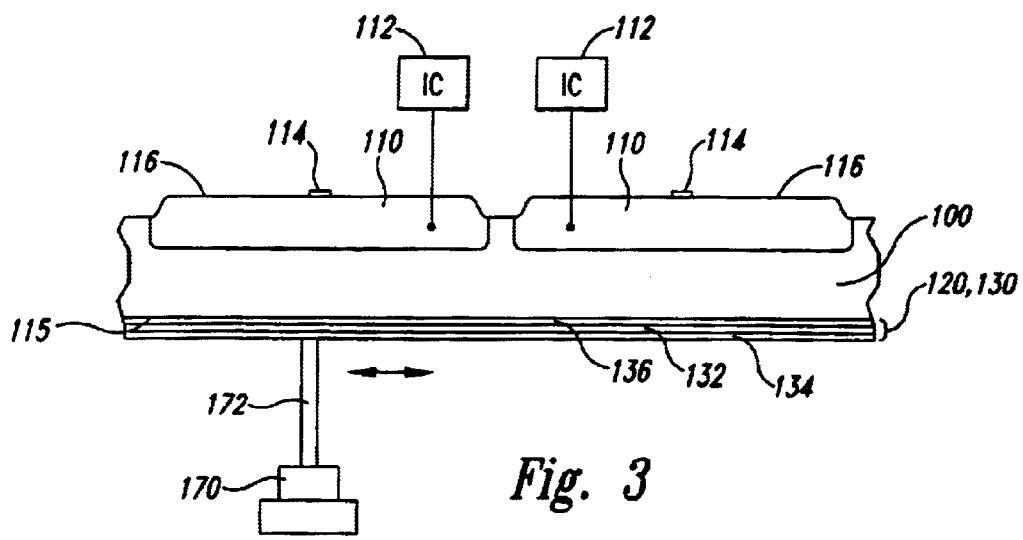
FIG. 3 is a partial cross-sectional view of another stage of the method for marking microelectronic dies in accordance with an embodiment of the invention.

The following disclosure is directed towards devices and methods for marking microelectronic dies, packaged microelectronic dies and other types of microelectronic devices. Many specific details of the invention are described below with reference to microelectronic dies fabricated on a semiconductor wafer to provide a thorough understanding of such embodiments. The present invention, however, can be practiced using other types of microelectronic substrates and also on packaged devices after the dies have been singulated and encapsulated in a package. A person skilled in the art will thus understand that the invention may have additional embodiments, or that the invention may be practiced without several of the details described below.

FIG. 1 is a schematic cross-sectional view of a wafer 100, a plurality of microelectronic dies 110 formed on the wafer 100, and a marking medium 120 applied to the wafer 100 in accordance with one embodiment of the invention. The wafer 100 can be a substrate composed of silicon, glass or other materials that are used in the fabrication of microelectronic dies. The dies 110 are typically formed on a front side of the wafer 100. The dies 110, for example, can be memory devices, microprocessors or other types of microelectronic dies. Each die 110 generally includes an integrated circuit 112 (shown schematically) and an array of contacts 114. The integrated circuit can include transistors, interconnecting circuitry and other components that are formed using a series of deposition, implanting, photolithography, planarizing and other fabrication procedures. The contacts 114 are typically an array of gold or solder bumps on one side of the dies 110 that are electrically coupled to the integrated circuit 112.

The marking medium 120 can be applied to a back side of the wafer 100. The marking medium 120 generally includes a contrast film section 130 and a transfer medium 150. The contrast film section 130 can have one or more contrast films and be adhered to the wafer 100, and the transfer medium 150 can be bonded to the contrast film section 130. Additionally, a carrier ring 160 can be attached to the transfer medium 150 to support the entire assembly of the wafer 100 and the contrast film section 130. The marking medium 120 is generally applied to the wafer 100 after the individual dies 110 have been fabricated. The marking medium 120, however, can be applied to the wafer at other stages of fabricating the microelectronic dies 110. Additionally, the marking medium 120 can have several different embodiments for producing accurate, high-contrast marks on bare microelectronic dies.

FIG. 2 is a partial cross-sectional view illustrating two dies 110 of the wafer 100 and a portion of the marking medium 120 in accordance with an embodiment of the invention. Each die 110 can have a first exterior surface 115 and a second exterior surface 116. The first exterior surface 115 can be the back side of the wafer 100, and the second exterior surface 116 can be discrete portions of the front side of the wafer 100. The array of contacts 114 is generally arranged on the second exterior surface 116 of each die 110. The dies 110 are generally separated by a scribe region 117 that can be scribed or cut to separate the dies 110 on the wafer 100 along a separation plane (shown by a dashed line).

The marking medium 120 of this embodiment includes a contrast film section 130 having an underlying contrast film 132 attached to the first exterior surface 115 of the dies 110 and an outer contrast film 134 attached to the underlying contrast film 132. The underlying contrast film 132 can be applied directly onto the first exterior surface 115 of the dies 110, or the underlying contrast film 132 can be applied to the first exterior surface 115 by an adhesive 136. The transfer medium 150 can be adhered to the outer contrast film 134. The contrast film section 130 and the transfer medium 150 operate to provide a medium that can be manipulated to produce high-contrast marks on each of the microelectronic dies 110.

The contrast films 132 and 134 of the contrast film section 130 generally have contrasting colors and react differently to a selected type of radiation. The underlying contrast film 132 and the outer contrast film 134 have optically contrasting characteristics, such as different colors or different textures. In general, one of the contrast films 132 or 134 has a light color or a reflective or transparent property, and the other of the contrast films 132 or 134 has a dark color or light absorbing/diffusing properties. The underlying contrast film 132 and the outer contrast film 134 can also react differently to a selected radiation such that a portion of the outer contrast film 134 can be selectively removed from the underlying contrast film 132 to create a mark on each die. In one particular embodiment, the underlying contrast film 132 is a white film, and the outer contrast film 134 is a black film. In another embodiment, the underlying contrast film can be a black film and the outer contrast film 134 can be a white film. In still other embodiments, the underlying contrast film 132 can be a color-coded film (e.g., red, blue, yellow, or other colors) and the outer contrast film 134 can be a black film. The underlying contrast film 132 and the outer contrast film 134 can be inks, polymeric sheets or other materials.

The particular colors or materials of the underlying contrast film 132 and the outer contrast film 134 can be selected so that the outer contrast film 134 changes upon exposure to the selected radiation such that a portion of the outer contrast film 134 can be selectively removed from the underlying contrast film 132. For example, when the outer contrast film 134 is a black film and the underlying contrast film 132 is a white film, the black outer contrast film 134 is consumed by a low-power infrared laser having a wavelength of 1,064 nm, but the white underlying contrast film 132 is not noticeably altered by this particular wavelength of infrared radiation. The 1,064 nm laser accordingly consumes a black outer contrast film 134 by selectively removing the black outer contrast film 134, but the 1,064 nm laser does not remove or otherwise consume the white underlying contrast film 132.

The marking medium 120 can be manufactured as a separate device that can be applied to the wafer 100 at the end of the die fabrication process. In one embodiment, the transfer medium 150 is a mounting tape that is commonly used in the singulating process for separating the dies 110 from each other. Suitable mounting tapes for use as the transfer medium 150 are manufactured by 3M corporation of St. Paul, Minn. The outer contrast film 134 can be applied to the transfer medium 150 by drawing the transfer medium 150 through a bath of ink or other type of liquid state material for the outer contrast film 134. The outer contrast film 134 can also be sputtered, screen printed or deposited onto the transfer medium 150 using other techniques. The underlying contrast film 132 can then be formed on the outer contrast film 134 in a similar manner, and an adhesive 136 can be deposited onto the underlying contrast film 132. The marking medium 120 can then be applied to the first exterior surface 115 of the dies 110 by pressing the adhesive 136 against the back side of the wafer 100.

FIG. 2 also illustrates one stage of a method for using the marking medium 120 to create a mark on the dies 110. At this stage, the marking medium 120 is applied to the first exterior surface 115 of the microelectronic dies by adhering the underlying contrast film 132 to the backside of the wafer 100. The marking medium 120 can then be cured to strengthen the bond between the adhesive 136 and the wafer 100. Before curing the marking medium 120, the bond between the wafer 100 and the underlying contrast film 132 formed by the adhesive 136 is preferably weaker than the bond between the outer contrast film 134 and the transfer medium 150. As a result, the marking medium 120 may be tacked onto the wafer 100 and then removed if there are any wrinkles or air pockets between the marking medium 120 and the wafer 100. After curing the marking medium 120, the strength of the bond between the wafer 100 and the underlying contrast film 132 is increased to be greater than the strength of the bond between the outer contrast film 134 and the transfer medium 150. The marking medium 120 may be cured by heating, radiation or merely leaving the marking medium 120 adhered to the wafer 100 for a period of time until the bond between the wafer 100 and the underlying contrast film 132 is greater than the bond between the outer contrast film 134 and the transfer medium 150. The transfer medium 150 can then be peeled from the outer contrast film 134 to leave the contrast film section 130 on the wafer 100.

FIG. 3 illustrates another stage of the method for marking the microelectronic dies 110 using the marking medium 120. At this stage of the method, the adhesive 136 has been cured and the transfer medium 150 has been removed from the contrast film section 130. This stage of the method continues by selectively removing a portion of the outer contrast film 134 from the underlying contrast film 132. In one embodiment, for example, a portion of the outer contrast film 134 can be selectively removed from the underlying contrast film 132 by exposing the portion of the outer contrast film 134 to a selected radiation that consumes (e.g., burns or vaporizes) a discrete, highly-defined section of the outer contrast film 134. In one specific example, the underlying contrast film 132 is a white film, the outer contrast film 134 is a black film, and the selected radiation is a 1,064 nm wavelength infrared beam 172 from a radiation source 170 (e.g., a laser). The infrared beam can be a highly-defined laser that is controlled by a precise X-Y motion device. The laser can be moved at a scan speed of 1,000–5,000 millimeters per second, and the laser can be operated at a power setting as low as 0.5–10 watts. In a particularly useful embodiment, the 1,064 nm wavelength infrared laser has a scan speed of 2,500–3,500 millimeters per second (i.e., 3,000 millimeters per second) and a power setting of 1–4 watts (i.e., 2–3 watts). The 1,064 nm wavelength infrared laser consumes the black outer contrast film 134, but it does not consume the white underlying contrast film 132. As a result, the combination of selecting contrast films in which the selected radiation consumes the outer contrast film at a rate that is greater than it consumes the underlying contrast film, or the laser does not consume the underlying contrast film at all, can produce a high-contrast mark on the first exterior surface 115 of each die 110.

Figure 4A:
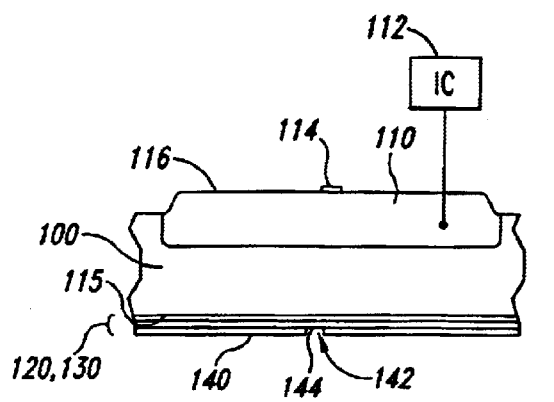
FIGS. 4A–4B are partial cross-sectional views of another stage of a method for marking microelectronic dies in accordance with additional embodiments of the invention.
Figure 4B:
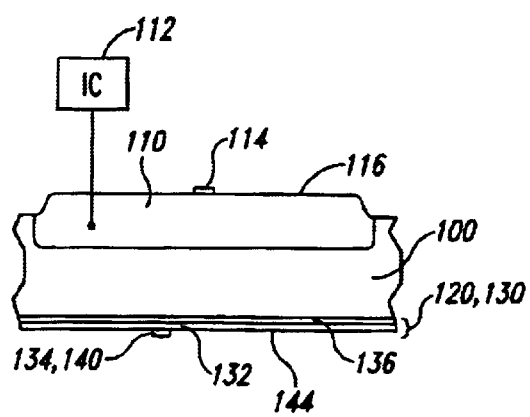

FIG. 4A illustrates a subsequent stage of marking the microelectronic dies 110 using the marking medium 120. At this stage of the method, a discrete portion of the outer contrast film 134 has been selectively removed from the underlying contrast film 132 to leave a patterned portion 140 of the outer contrast film 134 on the backside 115 of one of the dies 110. In this embodiment, the patterned portion 140 of the outer contrast film 134 has a gap 142 to expose a contrast surface 144 of the underlying contrast film 132. The patterned portion 140 of the outer contrast film and the contrast surface 144 of the underlying contrast film 132 define a mark on the die 110. FIG. 4B illustrates another embodiment of marking the microelectronic die 110 in which a significant portion of the outer contrast film 134 has been removed such that the patterned portion 140 projects above the contrast surface 144 of the underlying contrast film 132. The patterned portion 140 of the outer contrast film 134 and the contrast surface 144 of the underlying contrast film 132 shown in FIG. 4B also define a mark in this embodiment.

The portion of the outer contrast film 134 that is removed to create the patterned portion 140 can be removed using other types of radiation and/or other techniques than the 1,064 nm laser described above. For example, the outer contrast film 132 can be a photo-reactive material (e.g., resist) that changes upon exposure to a selected radiation such that the exposed portion of the outer contrast film becomes either more or less soluble than the unexposed portion of the outer contrast film in a selected solvent. The non-soluble portion of the outer contrast film 134 is then dissolved in the selected solvent to expose the contrast surface 144 of the underlying contrast film 132. The outer contrast film 134 can also be removed by directing a radiation through a mask configured in the shape of the marks. A suitable technique for using a mask and a laser to mark plastics with specific pigments is disclosed in U.S. Pat. No. 4,401,992, which is herein incorporated by reference.

Several embodiments of the marking medium 120 and the method for marking the microelectronic dies 110 are expected to provide high-contrast marks on bare microelectronic dies or packaged microelectronic devices. For example, because the underlying contrast film 132 and the outer contrast film 134 of the marking medium 10 can be made from different colors that have a high optical contrast (e.g., black and white), the resulting mark produced by removing a portion of the outer contrast film 134 has a very distinct, high-contrast. It is expected that machine-vision devices and other processing equipment will be able to correctly identify and efficiently handle bare microelectronic dies or other microelectronic devices that are marked using one of the forgoing embodiments of the marking medium. Therefore, several embodiments of the marking medium 120 and methods for marking the microelectronic dies 110 are expected to improve the efficacy of fabricating and packaging microelectronic dies.

Several embodiments of the marking medium 120 and methods for marking the microelectronic dies 110 are also expected to protect the integrated circuits in the microelectronic dies from being damaged by the marking process. Unlike other laser marking techniques that impinge the die with a laser, the marking medium 120 inhibits or prevents the laser beam from directly contacting the silicon of the microelectronic dies. Additionally, compared to conventional laser marking techniques, several embodiments of the marking method described above can effectively mark bare microelectronic dies using a very low power setting (e.g., less than 10 watts). Therefore, several embodiments of the marking medium 120 and methods for marking the microelectronic dies are expected to inhibit damage to the dies.

Another advantage of several embodiments of the marking medium 120 is that the dies can be identified by a color recognition scheme instead of symbol recognition systems. As explained above, the underlying contrast film 132 of the marking medium 120 can have a particular color that is recognized by a machine-vision device. The color can be selected according to the type of die in the process. For example, a first type of die can be identified using a red underlying contrast film and a second type of die can be identified by using a blue underlying contrast film. If a particular process is for the red type of dies, a machine-vision device can indicate an error message if it senses that a particular die has a blue underlying film. It will be appreciated that such color recognition techniques may be more reliable than symbol recognition techniques because machine-vision equipment may more accurately sense a color than a particular symbol.

Still another advantage of several embodiments of the marking medium 120 and methods for marking the microelectronic dies 110 is that it is expected to be a particularly fast procedure. Unlike conventional laser marking techniques that have a scan velocity of only a few hundred millimeters per second, it is expected that particular embodiments of the marking medium 120 will provide for scan speeds of several thousand millimeters per second. Such higher scan speeds for the laser will reduce the time required for marking each die, and thus several embodiments of the marking medium 120 are expected to increase the throughput of marking microelectronic dies.

Yet another advantage of several embodiments of the marking medium 120 and methods for marking the microelectronic dies 110 is that they do not increase the number of steps for handling and processing microelectronic dies. The marking medium 120 can be substituted for the typical backing tape used in singulating processes and other back-end procedures for processing a wafer of microelectronic devices. As such, the foregoing advantages explained above can be achieved without increasing the burden on other aspects of packaging microelectronic dies.

Figure 5:
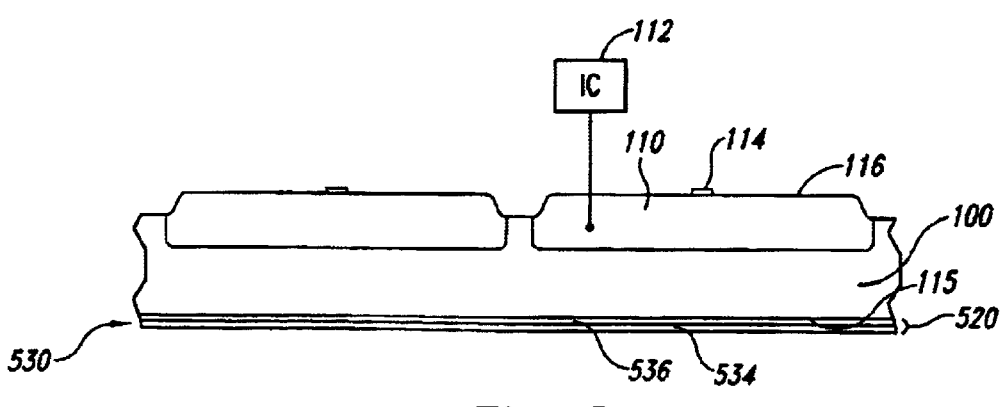
FIG. 5 is a partial cross-sectional view of another marking medium applied to a microelectronic die in accordance with an embodiment of the invention.

FIG. 5 is a partial cross-sectional view illustrating two dies 110 of the wafer 100 and a portion of a marking medium 520 in accordance with another embodiment of the invention. The marking medium 520 includes a contrast film section 530 having a single outer contrast film 534. The outer contrast film 534 can be adhered or bonded to the first exterior surface 115 by an adhesive 536. The outer contrast film 534 generally has a color that has a high optical contrast with respect to the first exterior surface 115 of the dies 110, and the outer contrast film 534 is also selectively removable from the first exterior surface 115 of the microelectronic dies 110. In one particular embodiment, the outer contrast film 534 is a black film that is consumed by an infrared laser beam having a wavelength of approximately 1,064 nm. The marking medium 520 can work in substantially the same manner as the marking medium 120 described above. The marking medium 520, however, is applied to the first exterior surface 115 of the dies 110 without an underlying contrast film. In one embodiment for making the marking medium 520, the adhesive 536 is deposited onto the back side of the wafer 100, and then the outer contrast film 534 is deposited onto the adhesive 536. The outer contrast film 534 and the adhesive 536, for example, can be deposited using sputtering techniques, screen printing processes, or other methods known in the semiconductor and the printing arts. In another embodiment for making the marking medium 520, the outer contrast film 534 and the adhesive 536 are formed on a transfer medium (not shown) and then applied to the backside of the wafer 160. When a portion of the outer contrast film 534 is removed, the silver mirror-like exterior surface 115 is optically distinguishable from the remaining portion of the outer contrast film 534.

Figure 6:
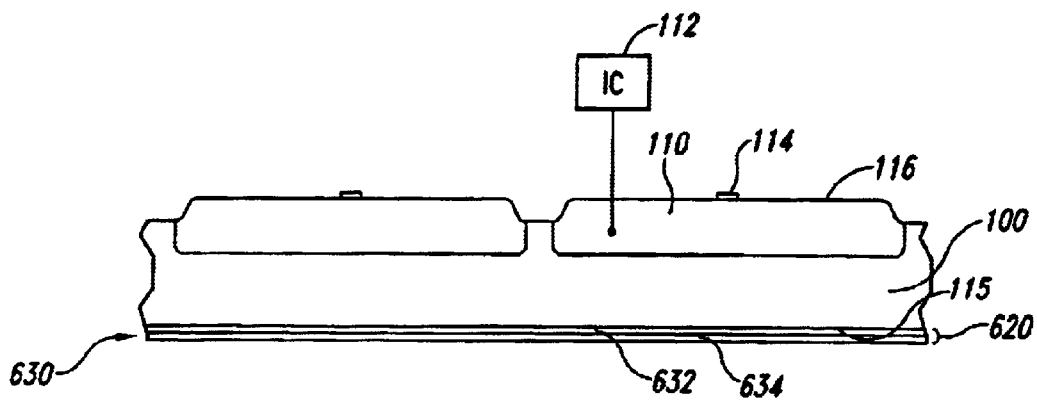
FIG. 6 is a partial cross-sectional view of still another marking medium applied to a microelectronic die in accordance with an embodiment of the invention.

FIG. 6 is a schematic, cross-sectional view illustrating a die 110 of the wafer 100 and a portion of a marking medium 620 in accordance with yet another embodiment of the invention. In this embodiment, the marking medium 620 includes a contrast film section 630 having an underlying contrast film 632 and an outer contrast film 634. The underlying contrast film 632 is applied directly to the first exterior surface 116 of the dies 110, and the outer contrast film 634 is applied directly to the underlying contrast film 632. The marking medium 620 does not include a transfer medium. The underlying contrast film 632 and the outer contrast film 634, however, can be the same as those as described above with respect to the marking medium 120. In operation, the underlying contrast film 632 and the outer contrast film 634 can be applied using sputtering techniques, screen printing techniques, or other processes known in the semiconductor and printing arts.

Figure 7:
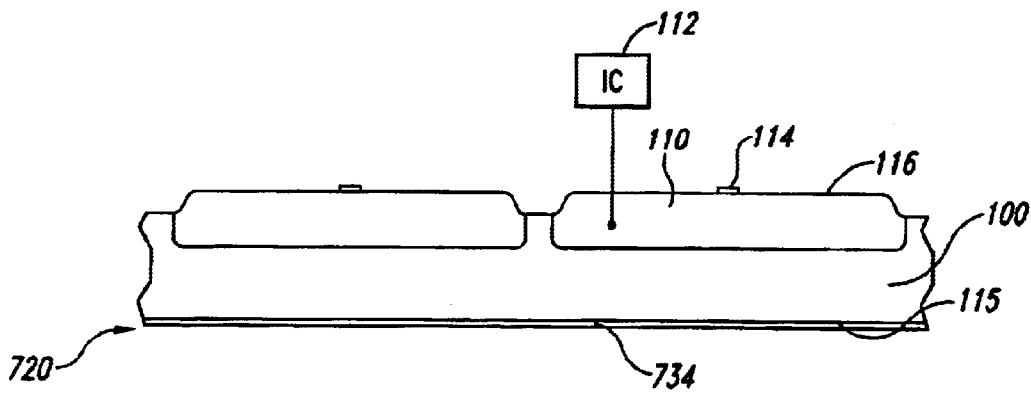
FIG. 7 is a partial cross-sectional view of yet another marking medium applied to a microelectronic die in accordance with yet another embodiment of the invention.

FIG. 7 is a partial cross-sectional view illustrating a die 110 of the wafer 100 and a portion of a marking medium 720 in accordance with still another embodiment of the invention. In this embodiment, the marking medium 720 has a single-layer outer contrast film 734 applied directly to the first exterior surface of the die 110. The outer contrast film 734 can be sputtered or screen printed onto the first exterior surface 115 of the microelectronic die 110. The outer contrast film 734 is selected to have a high-contrast color with respect to the first exterior surface 115 of the microelectronic die 110, and the outer contrast film 734 is composed of a material that can be readily consumed by a laser or other source of radiation. In operation, a portion of the outer contrast film 734 is exposed to the selected radiation to remove that portion of the outer contrast film 734 from the back side of the wafer 100. In a particular example, the outer contrast film 734 is a black film applied to the first exterior surface 115 of the die 110, and then an infrared laser having a wavelength of 1,064 nm consumes a portion of the outer contrast film 734 in a pattern corresponding to the marks. The exposed portions of the first exterior surface 115 have a mirror-like optical property compared to the black surface of the remaining portion of the outer contrast film 734.

Figure 8:
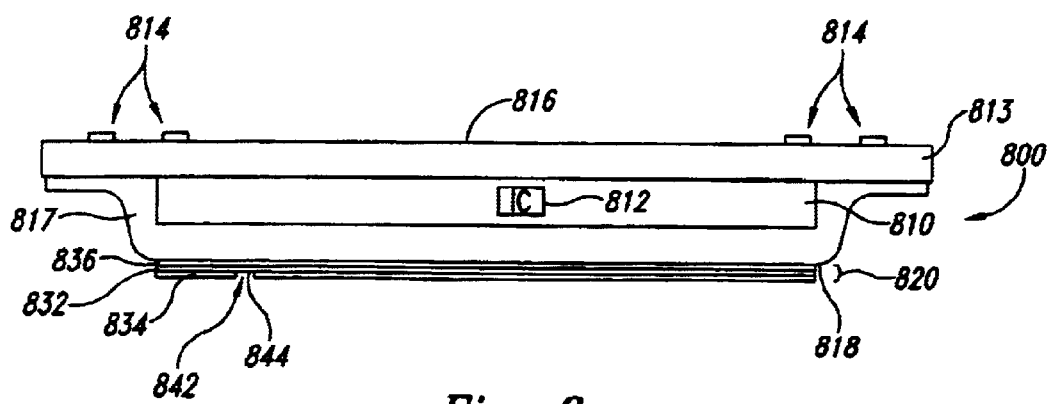
FIG. 8 is a partial cross-sectional view of a marking medium applied to a packaged microelectronic device in accordance with an embodiment of the invention.
Figure 9:
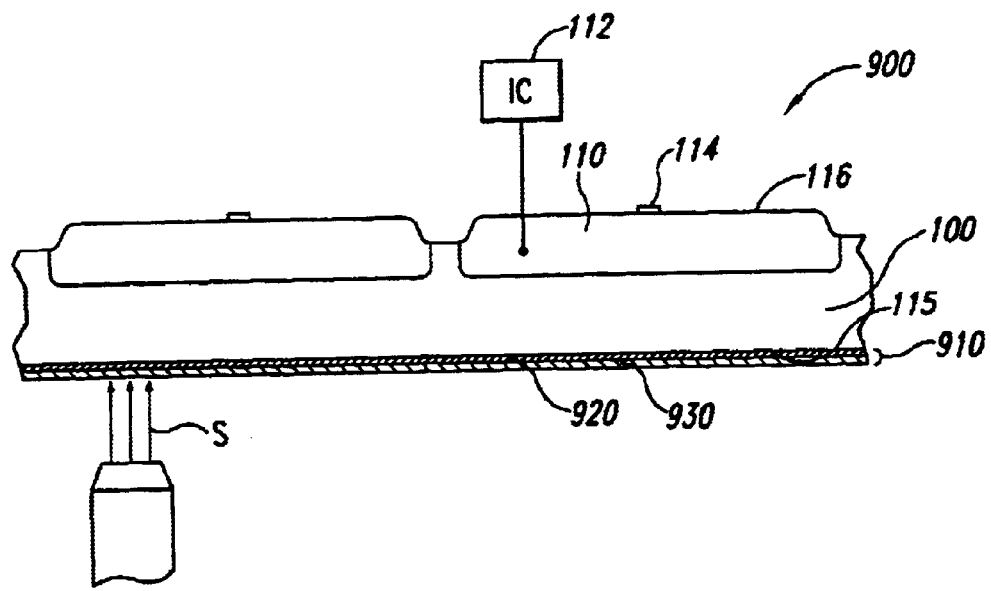
Figure 10:
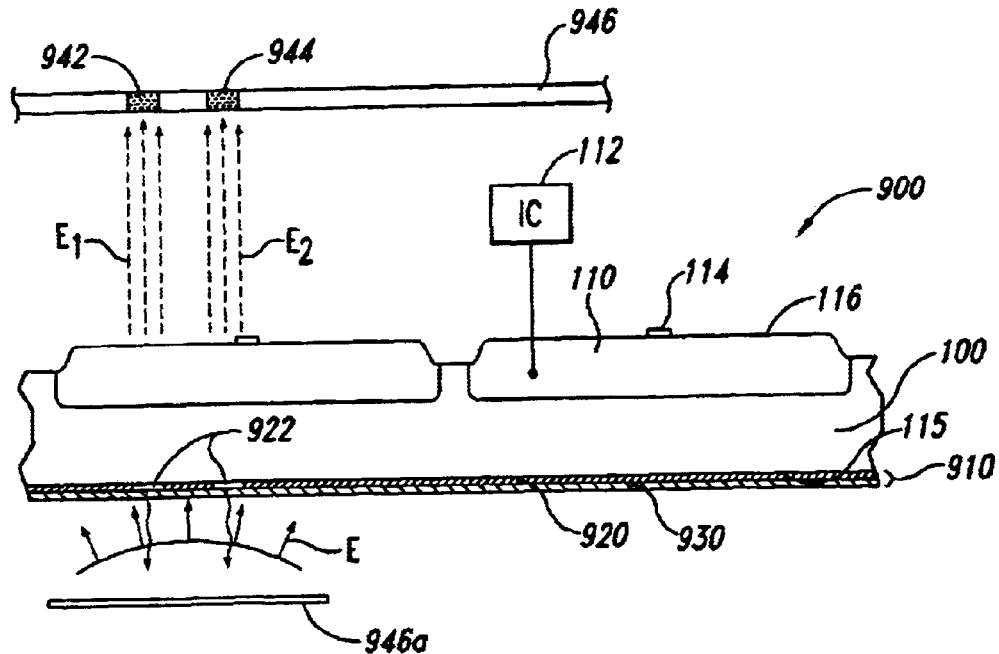
Figure 11:
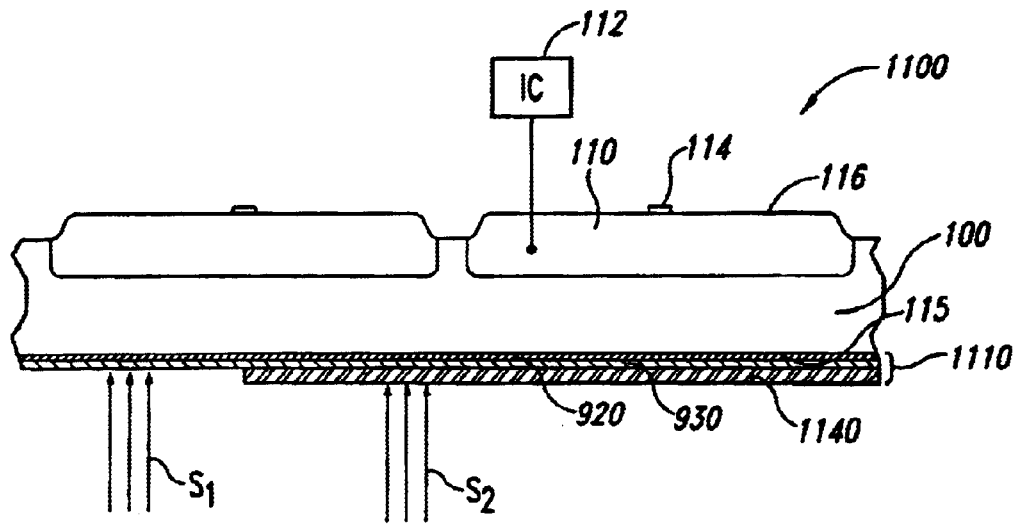
Figure 12:
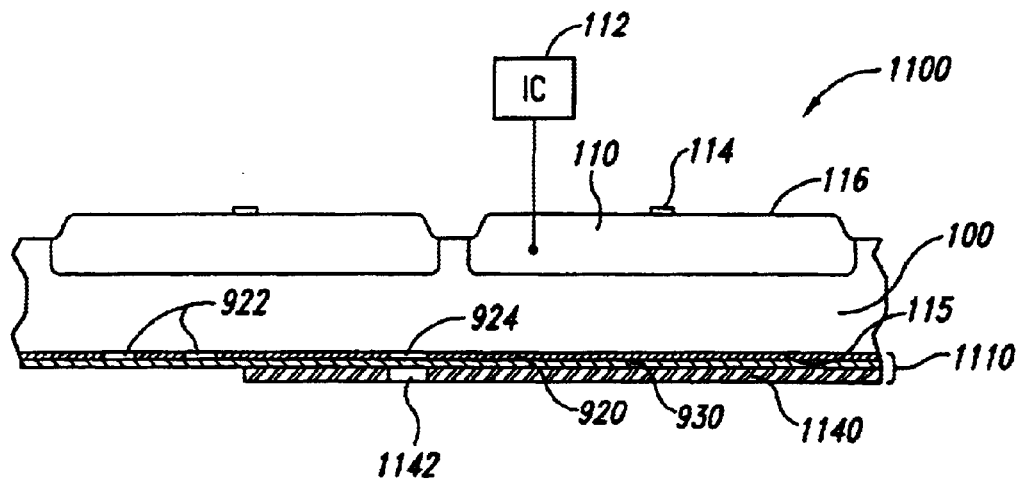

FIG. 8 is a schematic cross-sectional view of a packaged microelectronic device 800 having a marking medium 820 in accordance with another embodiment of the invention. In this embodiment, the packaged device 800 includes a microelectronic die 810 having an integrated circuit 812, and a substrate 813 having a plurality of contacts 814 formed in an array. The contacts 814, for example, can be solder ball pads for a ball grid array. The integrated circuit 812 of the microelectronic die 810 is electrically coupled to the contacts 814 of the contact array. The microelectronic device 800 also includes a covering 817 encapsulating the microelectronic die 810. The covering 817 can have a flat surface 818 defining the first exterior surface of the microelectronic device 800, and the substrate 813 can have a surface 816 defining the second exterior surface of the microelectronic device 800.

The marking medium 820 can be any of the marking mediums 120–720 explained above with reference to marking a bare microelectronic die 110. In the particular embodiment shown in FIG. 8, the marking medium 820 has a first underlying contrast film 832 attached to the first exterior surface 818 of the covering 817 by an adhesive 836. The marking medium 820 can further include an outer contrast film or layer 834 bonded to the underlying contrast film 832. A portion of the outer contrast film 834 can be selectively removed from the underlying contrast film 832 to form a gap 842 for exposing a contrast surface 844 of the underlying contrast film 832. The portion of the outer contrast film 834 can be selectively removed using any of the techniques explained above with respect to FIGS. 1–7.

From the foregoing it will be appreciated that several specific embodiments of the invention have been described herein for purposes of illustration, but that various modifications may be made without deviating from the spirit and scope of the invention. The underlying contrast film, for example, can have several different colors so that different exposed surfaces of the underlying contrast film perform different functions. Accordingly, the invention is not limited except as by the appended claims.

What is claimed is:

1. A microelectronic device, comprising:
   a microelectronic component including a first exterior surface and a second exterior surface having a contact array with a plurality of contacts;
   an integrated circuit coupled to the contacts; and
   a marking medium having an underlying contrast film attached to the first exterior surface of the component, an outer contrast film attached to the underlying contrast film, and a transfer medium attached to the outer contrast film, the outer contrast film having a high optical contrast with respect to the underlying contrast film, and the outer contrast film being changeable by a selected radiation to be selectively removed from the underlying contrast film.

2. The microelectronic device of claim 1 wherein:
   the microelectronic component is a microelectronic die, the first exterior surface being one side of the die, the second exterior surface being another side of the die, the contact array being a plurality of bump pads on the second exterior surface, and the integrated circuit is a pert of the die; and
   the underlying contrast film is a first color and the outer contrast film is a second color, the underlying contrast film being attached to the first exterior surface of the die.

3. The microelectronic device of claim 1 wherein:
   the microelectronic component is a microelectronic die, the first exterior surface being one side of the die, the second exterior surface being another side of the die, the contact array being a plurality of bump pads on the second exterior surface, and the integrated circuit is a part of the die; and
   the underlying contrast film is white and the outer contrast film is black, the underlying contrast film being attached to the first exterior surface on the die.

4. The microelectronic device of claim 1 wherein:
   the microelectronic component is a microelectronic die, the first exterior surface being one side of the die, the second exterior surface being another side of the die, the contact array being a plurality of bump pads on the second exterior surface, and the integrated circuit is a part of the die; and
   the underlying contrast film is white and the outer contrast film is black, the underlying contrast film being adhered to the first exterior surface of the die by an adhesive.

5. The microelectronic device of claim 1 wherein:
   the microelectronic component is a microelectronic die, the first exterior surface being one side of the die, the second exterior surface being another side of the die, the contact array being a plurality of bump pads on the second exterior surface, and the integrated circuit is part of the die; and
   the underlying contrast film is white and the outer contrast film is black, the underlying contrast film being printed on the first exterior surface of the die.

6. The microelectronic device of claim 1 wherein:
   the microelectronic component is a microelectronic die, the first exterior surface being one side of the die, the second exterior surface being another side of the die, the contact array being a plurality of bump pads on the second exterior surface, and the integrated circuit is part of the die;
   the underlying contrast film is white and the outer contrast film is black, the underlying contrast film being adhered to the first exterior surface of the die by an adhesive; and
   the transfer medium comprises a backing tape applied to the outer contrast film.

7. The microelectronic device of claim 1 wherein:
   the microelectronic component is a packaged device having a microelectronic die and a package encasing at least a portion of the die, the first exterior surface being one side of the package, the second exterior surface being another side of the package, the contact array being a plurality of ball pads on the second exterior surface of the package, and the integrated circuit being a part of the die and coupled to the ball pads on the package; and
   the underlying contrast film is a first color and the outer contrast film is a second color, the underlying contrast film being attached to the first exterior surface of the package.

8. The microelectronic device of claim 1 wherein:

the microelectronic component is a packaged device having a microelectronic die and a package encasing at least a portion of the die, the first exterior surface being one side of the package, the second exterior surface being another side of the package, the contact array being a plurality of ball pads on the second exterior surface of the, package, and the integrated circuit being a part of the die and coupled to the ball pads on the package; and the underlying contrast film is white and the outer contrast film is black, the underlying contrast film being attached to the first exterior surface of the package.

9. A microelectronic device, comprising:

a microelectronic component including a first exterior surface and a second exterior surface having a contact array with a plurality of contacts;

an integrated circuit coupled to the contacts; and a marking medium having an outer contrast film attached to the first exterior surface of the component and a transfer medium attached to the outer contrast film, the outer contrast film having a high optical contrast with respect to the first exterior of the component, and the outer contrast film being changeable by a selected radiation to be selectively removed from the component.

10. The microelectronic device of claim 9 wherein:

the microelectronics component is a microelectronic die, the first exterior surface being one side of the die, the second exterior surface being another side of the die, the contact array being a plurality of bump pads on the second exterior surface, and the integrated circuit is a part of the die; and the outer contrast film is black.

11. The microelectronic device of claim 9 wherein:

the microelectronic component is a packaged device having a microelectronic die and a package encasing at least a portion of the die, the first exterior surface being one side of the package, the second exterior surface being another side of the package, the contact array being a plurality of ball pads on the second exterior surface of the package, and the integrated circuit being a part of the die and coupled to the ball pads on the package; and the outer contrast film is a color that is optically distinguishable from the first exterior surface of the package.

12. A marking medium for marking a microelectronic device having a first exterior surface, a second exterior surface having a contact array with a plurality of contacts, and an integrated circuit coupled to the contacts, the marking medium comprising:

an underlying contrast film for attachment to the first exterior surface;

an outer contrast film attached to the underlying contrast film, the outer contrast film having a high optical contrast with respect to the underlying contrast film, and the outer contrast film being changeable by a selected radiation to be selectively removed from the underlying contrast film; and a transfer medium attached to the outer contrast film.

13. The marking medium of claim 12 wherein:

the underlying contrast film is a first color;

the outer contrast film is second color; and the transfer medium is a backing tape.

14. The marking medium of claim 13 wherein:

the underlying contrast film is white;

the outer contrast film is black; and the transfer medium is a backing tape.

15. The marking medium of claim 13 wherein:

the underlying contrast film is a light color;

the outer contrast film is black; and the transfer medium is a backing tape.

16. A marking medium for marking a microelectronic device having a first exterior surface, a second exterior surface having a contact array with a plurality of contacts, and an integrated circuit coupled to the contacts, the marking medium comprising:

an outer contrast film for attachment to the first exterior surface of the device, the outer contrast film having a high optical contrast with respect to the first exterior surface of the device, and the outer contrast film being changeable by a selected radiation to be selectively removed from the first exterior surface of the device; and a transfer medium attached to the outer contrast film.

17. The marking medium of claim 16 wherein the outer contrast film is black and the transfer medium is a backing tape.

18. The marking medium of claim 16 wherein the transfer medium is a backing tape and the outer contrast film is a black ink printed on a surface of the backing tape.

* * * * *

UNITED STATES PATENT AND TRADEMARK OFFICE
CERTIFICATE OF CORRECTION

PATENT NO. : 6,731,016 B2
DATED : May 4, 2004
INVENTOR(S) : Darin L. Peterson

It is certified that error appears in the above-identified patent and that said Letters Patent is hereby corrected as shown below:

Column 2,
Line 7, delete "to" between "marking" and "procedures";

Column 9,
Line 9, "bums" should be -- burns --;

Column 10,
Line 4, "pert" should be -- part --;

Column 11,
Line 8, delete comma between "the" and "package";
Line 29, "microelectronics" should be -- microelectronic --.

Signed and Sealed this

Eighth Day of March, 2005

JON W. DUDAS
*Director of the United States Patent and Trademark Office*